United States Patent
Yang et al.

(10) Patent No.: US 11,264,570 B2
(45) Date of Patent: Mar. 1, 2022

(54) ALIGNMENT METHOD, ALIGNMENT DEVICE AND EVAPORATION EQUIPMENT

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 16/642,676

(22) PCT Filed: Mar. 22, 2019

(86) PCT No.: PCT/CN2019/079217
§ 371 (c)(1),
(2) Date: Feb. 27, 2020

(87) PCT Pub. No.: WO2019/214352
PCT Pub. Date: Nov. 14, 2019

(65) Prior Publication Data
US 2020/0266351 A1 Aug. 20, 2020

(30) Foreign Application Priority Data

May 9, 2018 (CN) .......................... 201810436372.7

(51) Int. Cl.
*H01L 51/00* (2006.01)
*G06T 7/70* (2017.01)
(Continued)

(52) U.S. Cl.
CPC ........ *H01L 51/0012* (2013.01); *C23C 14/042* (2013.01); *C23C 14/24* (2013.01);
(Continued)

(58) Field of Classification Search
CPC ... H01L 51/0011; H01L 21/68; H01L 21/682; H01L 2223/54426; H01L 23/544; H01L 21/67259
See application file for complete search history.

(56) References Cited

U.S. PATENT DOCUMENTS 11,053,579 B2 * 7/2021 Li ...................... H01L 51/0096
2012/0006264 A1 1/2012 Ukigaya et al.
(Continued)

FOREIGN PATENT DOCUMENTS

| CN | 102312189 A | 1/2012 |
| CN | 103597625 A | 2/2014 |

(Continued)

OTHER PUBLICATIONS

International Search Report of PCT/CN2019/079217 and English translation, dated May 28, 2019, 13 pages.

*Primary Examiner* — Jaehwan Oh
(74) *Attorney, Agent, or Firm* — Muncy, Geissler, Olds & Lowe, P.C.

(57) ABSTRACT

An alignment method, an alignment device and evaporation equipment are provided. The alignment device includes: a first alignment module, located outside an evaporation chamber and configured to determine relative position information between a substrate to be evaporated and a mask for evaporation; a second alignment module, located in the evaporation chamber and configured to adjust a position of the substrate to be evaporated and/or the mask for evaporation according to the relative position information until an orthographic projection of a first alignment mark of the substrate to be evaporated on the mask for evaporation at least partially overlaps a hollowed area of the mask for evaporation, obtain position information of the first alignment mark through the hollowed area, and adjust a position (Continued)

of the substrate to be evaporated and/or the mask for evaporation according to the position information.

16 Claims, 1 Drawing Sheet

(51) Int. Cl.
| | |
|---|---|
| C23C 14/04 | (2006.01) |
| C23C 14/24 | (2006.01) |
| C23C 14/54 | (2006.01) |
| H01L 51/56 | (2006.01) |
| H04N 5/225 | (2006.01) |

(52) U.S. Cl.
CPC ............... C23C 14/54 (2013.01); G06T 7/70 (2017.01); H01L 51/001 (2013.01); H01L 51/0011 (2013.01); H01L 51/56 (2013.01); H04N 5/2253 (2013.01); H04N 5/2256 (2013.01)

(56) References Cited

U.S. PATENT DOCUMENTS

| | | | |
|---|---|---|---|
| 2014/0170785 A1 | 6/2014 | Kurita et al. | |
| 2016/0372715 A1* | 12/2016 | Seo | ................ C23C 16/455 |
| 2018/0309091 A1* | 10/2018 | Kobayashi | ............. C23C 14/04 |
| 2019/0013229 A1* | 1/2019 | Cho | ................ H01L 21/68742 |
| 2019/0097135 A1* | 3/2019 | Ichihara | ................ C23C 14/50 |
| 2020/0181755 A1* | 6/2020 | Kobayashi | ............. H01L 51/001 |
| 2020/0308687 A1* | 10/2020 | Li | ................ H01L 51/0011 |
| 2020/0392644 A1* | 12/2020 | Krogstrup Jeppesen | ................ C23C 14/28 |

FOREIGN PATENT DOCUMENTS

| | | |
|---|---|---|
| JP | S6336544 A | 2/1988 |
| KR | 20130014157 A | 2/2013 |

\* cited by examiner

ALIGNMENT METHOD, ALIGNMENT DEVICE AND EVAPORATION EQUIPMENT

CROSS-REFERENCE TO RELATED APPLICATIONS

This application is a U.S. national phase application of a PCT Application No. PCT/CN2019/079217 filed on Mar. 22, 2019, which claims a priority to Chinese Patent Application No. 201810436372.7, filed in China on May 9, 2018, the disclosures of which are incorporated herein by reference in their entirety.

TECHNICAL FIELD

The present disclosure relates to the field of display technology, and in particular to an alignment method, an alignment device and evaporation equipment.

BACKGROUND

Silicon-based micro organic light-emitting diode (OLED) display is based on both microelectronics and optoelectronics technologies, and covers a wide range of technical fields, including optoelectronics, microelectronics, electronic information, and optics, etc., which is a multidisciplinary research field involving physics, chemistry, material science and electronics, etc. The combination of OLED technology and complementary metal oxide semiconductor (CMOS) technology is due to a cross integration of the optoelectronic industry and the microelectronics industry, which facilitates the development of a new generation of micro displays, and also promotes the research and development of silicon-based organic electronics or even silicon-based molecular electronics.

Compared with digital micro mirror device (DMD) and liquid crystal on silicon (LCOS) micro displays, silicon-based micro OLED displays have excellent display characteristics. The OLED has high brightness, rich colors, low driving voltage, fast response speed, low power consumption, and provides an excellent user experience; and the OLED is an all-solid-state device with good shock resistance and a wide operating temperature range (~40° C.~85° C.), suitable for military and special applications; the OLED is also a self-luminous device, thereby dispensing with a backlight, and having a wide viewing angle range and a reduced thickness, which is conducive to reducing the size of a display system, and is particularly suitable for a near-eye display system.

In the related art, when it comes to performing evaporation on a light-emitting layer of a silicon-based micro OLED display, the conventional glass-based alignment scheme cannot be applied any more since the silicon wafer is opaque, and the alignment requirements of the silicon-based OLED display substrate are more stringent than those of the conventional glass-based OLED display substrates, as a result, alignment during evaporation of silicon-based OLED display substrates remains a problem many OLED evaporation equipment manufacturers are striving to tackle.

SUMMARY

In a first aspect, an embodiment of the present disclosure provides an alignment device, including:

a first alignment module, located outside the evaporation chamber and configured to determine relative position information between a substrate to be evaporated and a mask for evaporation;

a second alignment module, located in the evaporation chamber and configured to adjust a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtain position information of the first alignment mark through the hollowed area, and adjust the position of at least one of the substrate to be evaporated and the mask for evaporation according to the position information.

Further, the first alignment module includes:

an image acquisition unit, configured to scan a third alignment mark of the substrate to be evaporated to determine first position information of a center of the substrate to be evaporated, and configured to scan a second alignment mark of the mask for evaporation to determine second position information of a center of the mask for evaporation;

a processing unit, configured to determine the relative position information between the substrate to be evaporated and the mask for evaporation according to the first position information and the second position information.

Further, the second alignment module includes:

a light source, configured to emit light onto the first alignment mark of the substrate to be evaporated located directly above the mask for evaporation;

an image detector, located on a side of the substrate to be evaporated that is facing away from the mask for evaporation, where a detection surface of the image detector faces downward;

a light propagation structure, located on a side of the mask for evaporation that is facing away from the substrate to be evaporated, the light propagation structure directly facing the hollowed area, and configured to transmit light reflected by the first alignment mark to the image detector.

Further, the light propagation structure includes:

a first reflector, located on a side of the mask for evaporation that is facing away from the substrate to be evaporated, and having a reflective surface oriented to the hollowed area;

a second reflector, having a reflective surface oriented to the reflective surface of the first reflector and the detection surface of the image detector.

Further, an included angle between the reflective surface of the first reflector and the reflective surface of the second reflector is 90°.

Further, the light propagation structure further includes:

a container, having an opening oriented to the mask for evaporation and a movable cover provided at the opening, the movable cover is configured to cover or expose the opening by moving;

the first reflector and the second reflector are located in the container, in case that the opening is not covered by the cover, the first reflector and the second reflector are configured to transmit the light reflected by the first alignment mark to the image detector.

Further, the first reflector and the second reflector are movably disposed in the container.

Further, a distance between the light propagation structure and the mask for evaporation is greater than or equal to a distance between an evaporation source and the mask for evaporation.

Further, the second alignment module includes two light propagation structures; the two light propagation structures are respectively located on two sides of the evaporation source.

An embodiment of the present disclosure further provides an alignment method applied to the alignment device described above, and the alignment method includes:

determining the relative position information between the substrate to be evaporated and the mask for evaporation by using the first alignment module when the substrate to be evaporated and the mask for evaporation are outside the evaporation chamber;

after the substrate to be evaporated and the mask for evaporation are moved into the evaporation chamber, by using the second alignment module, adjusting a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtaining position information of the first alignment mark through the hollowed area, and adjusting the position of at least one of the substrate to be evaporated and the mask for evaporation according to the position information, to complete alignment of the substrate to be evaporated and the mask for evaporation.

Further, the determining the relative position information between the substrate to be evaporated and the mask for evaporation when the substrate to be evaporated and the mask for evaporation are outside the evaporation chamber includes:

by using the image acquisition unit, scanning the third alignment mark of the substrate to be evaporated to determine first position information of the center of the substrate to be evaporated, and scanning the second alignment mark of the mask for evaporation to determine the second position information of the center of the mask for evaporation;

determining the relative position information between the substrate to be evaporated and the mask for evaporation according to the first position information and the second position information by using the processing unit.

Further, obtaining the position information of the first alignment mark through the hollowed area includes:

emitting light onto the first alignment mark by using the light source;

transmitting the light reflected by the first alignment mark to the image detector by using the light propagation structure;

obtaining the position information of the first alignment mark by using the image detector.

Further, prior to obtaining the position information of the first alignment mark through the hollowed area, the method further includes:

exposing the opening of the container by moving the movable cover;

after completing the alignment of the substrate to be evaporated and the mask for evaporation, the method further includes:

covering the opening of the container by moving the movable cover.

An embodiment of the present disclosure further provides evaporation equipment including the alignment device as described above.

DETAILED DESCRIPTION

In order to make the technical problems, technical solutions and advantages of the embodiments of the present disclosure more clear, the present disclosure will be clearly and completely described in detail below with reference to the drawings and specific embodiments.

The OLED display module in the related art is composed of a thin film transistor backplane and light emitting devices. The thin film transistor backplane implements functions of a compensation circuit and a peripheral gate driving circuit, and the light emitting devices implement a light emitting function.

At present, mainstream OLED display devices are generally evaporated by using fine metal masks, and the highest pixel density may reach about 600 PPI. In order to develop OLED display devices with higher pixel density, silicon-based micro OLED displays are introduced. For the silicon-based micro OLED displays, driving circuits including pixel driving circuits and gate driving circuits, etc. are manufactured on the wafer. After the driving circuits are manufactured on the wafer, anodes, light emitting devices, and cathodes are formed, and finally a color film cover is manufactured.

The pixel density of the micro OLED displays is generally above 2000 PPI. Therefore, the control requirements with respect to foreign particle are particularly strict. When a wafer having a driving circuit layer and anodes manufactured is evaporated to form light emitting devices, the front side of the wafer is facing downward, i.e., along the direction of gravity, as such, it is difficult for the foreign particles in the evaporation chamber to fall on the wafer. However, since the wafer is opaque, a charge-coupled device (CCD) alignment device cannot perform alignment from above the wafer. If the CCD aligns the wafer and the mask from below the wafer, the foreign particles in the evaporation chamber will directly attach to the CCD lens, leading to an alignment failure.

In order to solve the above problems, an embodiment of the present disclosure provides an alignment method, an alignment device, and evaporation equipment, such that the silicon-based OLED display substrate may be accurately aligned when evaporation is performed on the silicon-based OLED display substrate.

An embodiment of the present disclosure provides an alignment device, including:

a first alignment module, located outside the evaporation chamber and configured to determine relative position information between a substrate to be evaporated and a mask for evaporation;

the second alignment module, located in the evaporation chamber and configured to adjust a position of the substrate to be evaporated and/or the mask for evaporation according to the relative position information, so that an orthographic projection of a first alignment mark of the substrate to be evaporated on the mask for evaporation at least partially overlaps a hollowed area of the mask for evaporation, obtain position information of the first alignment mark through the hollowed area, and adjust the position of the substrate to be evaporated and/or the mask for evaporation according to the position information, to complete alignment of the substrate to be evaporated and the mask for evaporation.

In the present embodiment, firstly, the relative position information between the substrate to be evaporated and the mask for evaporation is obtained outside the evaporation chamber. After the substrate to be evaporated and the mask for evaporation enter the evaporation chamber, a coarse alignment is performed by using the relative position information between the substrate to be evaporated and the mask for evaporation, so that an orthographic projection of the first alignment mark of the substrate to be evaporated on the mask for evaporation and the hollowed area of the mask for evaporation at least partially overlap. Then, the position information of the first alignment mark is obtained through the hollowed area, and a fine alignment is performed by using the position information of the first alignment mark, so as to complete precise alignment of the substrate to be evaporated and the mask for evaporation. Through the technical solution of the present disclosure, precise alignment of the substrate to be evaporated and the mask for evaporation may be achieved when the substrate to be evaporated is opaque. In order to ensure that the position information of the first alignment mark may be obtained through the mask for evaporation, it is necessary to provide a hollowed area on the mask for evaporation, so that the position information of the first alignment mark may be obtained through the hollowed area of the mask for evaporation.

Further, the first alignment module includes:

an image acquisition unit, configured to scan a third alignment mark of the substrate to be evaporated to determine first position information of a center of the substrate to be evaporated, and configured to scan a second alignment mark of the mask for evaporation to determine second position information of a center of the mask for evaporation;

a processing unit, configured to determine the relative position information between the substrate to be evaporated and the mask for evaporation according to the first position information and the second position information.

The third alignment mark may be at least one location point on the edge of the substrate to be evaporated, and the first position information of the center of the substrate to be evaporated may be determined through the position information of the third alignment mark. In case that the substrate to be evaporated is circular, since a circle may be defined by three points, the third alignment mark may be three location points on the edge of the substrate to be evaporated. The position information of the substrate to be evaporated may be determined based on the three location points, and then the first position information of the center of the substrate to be evaporated may be determined. In case that the substrate to be evaporated is of other shapes, the quantity of location points of the third alignment mark may be determined based on the shape of the substrate to be evaporated, as long as the position of the substrate to be evaporated may be uniquely determined based on the third alignment mark.

Figure 1:
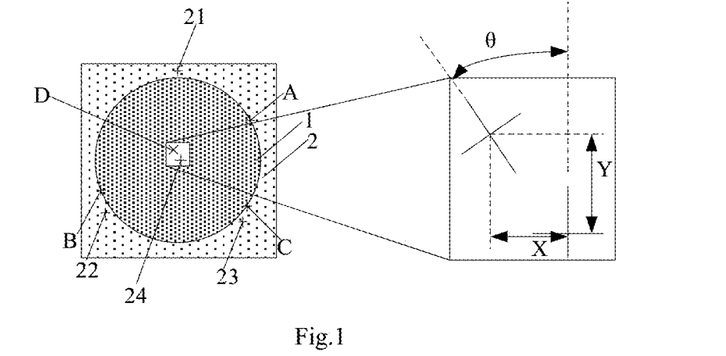
FIG. 1 is a schematic diagram of acquiring relative position information between a wafer and a mask according to an embodiment of the present disclosure.

Specifically, the image acquisition unit may adopt the CCD. Taking the substrate to be evaporated being a wafer for example, as shown in FIG. 1, outside the evaporation chamber, the position information of three location points A, B, and C on the edge of the wafer 1 may be acquired through the CCD, and the position information of the center D of the wafer 1 is determined based on the position information of A, B, and C. Since the area of the mask 2 for evaporation is larger than the area of the wafer 1, when the wafer 1 is located above the mask 2, the second alignment mark on the mask 2 may still be exposed to be acquired by the CCD. As shown in FIG. 1, the position information of three second alignment marks 21, 22, and 23 on the mask 2 is acquired through the CCD separately, and the position information of the center 24 of the mask is determined according to the position information of 21, 22, and 23. Then, the relative position information between the center D of the wafer 1 and the center 24 of the mask 2 may be determined according to the position information of the center D and the position information of the center 24, i.e., the relative position information between the wafer 1 and the mask 2 may be determined. As shown in FIG. 1, the relative position information includes a distance X between the center D and the center 24 on the x axis, a distance Y between the center D and the center 24 on the y axis, and an included angle $\theta$ between a line connecting the center D and the center 24 and the y axis.

In the process of moving the substrate to be evaporated and the mask for evaporation from outside of the evaporation chamber into the evaporation chamber, the relative position of the substrate to be evaporated and the mask for evaporation remains substantially unchanged. Therefore, after the substrate to be evaporated and the mask for evaporation enter the evaporation chamber, the relative position information between the substrate to be evaporated and the mask for evaporation obtained previously outside the evaporation chamber may be used to align the substrate to be evaporated and the mask for evaporation. This alignment is done by means of data comparison, so there are some errors. But it can have a coarse alignment effect.

Further, in the evaporation chamber, the mask for evaporation is located directly below the substrate to be evaporated, and the second alignment module includes:

a light source, configured to emit light onto the first alignment mark;

an image detector, located on a side of the substrate to be evaporated that is facing away from the mask for evaporation, where a detection surface of the image detector faces downward;

a light propagation structure, located on a side of the mask for evaporation that is facing away from the substrate to be evaporated, the light propagation structure directly facing the hollowed area, and configured to transmit light reflected by the first alignment mark to the image detector.

In order to prevent foreign particles in the evaporation chamber from falling on the substrate to be evaporated, the surface to be evaporated of the substrate to be evaporated is placed in a face-down manner in the evaporation chamber, i.e., along the direction of gravity. The mask for evaporation is located directly below the substrate to be evaporated. In addition, in order to prevent foreign particles from falling on the detection surface of the image detector and misting the lens on the detection surface, the detection surface of the image detector is also placed in a face-down manner. In order to ensure that the image detector may acquire the image of the first alignment mark, it is necessary to use a light propagation structure to transmit the light reflected by the first alignment mark to the image detector. Specifically, the image detector may also adopt a CCD.

Further, the light propagation structure includes:

a first reflector, located on a side of the mask for evaporation that is facing away from the substrate to be evaporated, and having a reflective surface oriented to the hollowed area;

a second reflector, having a reflective surface oriented to the reflective surface of the first reflector and the detection surface of the image detector.

That the reflective surface of the first reflector is oriented to the hollowed area refers to: the light exiting through the hollowed area may reach the reflective surface of the first reflector and be reflected by the reflective surface of the first reflector. That the reflective surface of the second reflector is oriented to the reflective surface of the first reflector and the detection surface of the image detector refers to: the light emitted by the reflective surface of the first reflector may reach the reflective surface of the second reflector and be reflected by the reflective surface of the second reflector, and the detection surface of the image detector may receive the light reflected by the reflective surface of the second reflector.

In an optional embodiment, an included angle between the reflective surfaces of the first reflector and the second reflector is 90°. In this case, the propagation direction of the light incident on the reflective surface of the first reflector is parallel to the propagation direction of the light exiting from the reflective surface of the second reflector.

Further, the light propagation structure further includes:

a container, having an opening oriented to the mask for evaporation and a movable cover provided at the opening, and the opening is capable of being covered or exposed by moving the movable cover;

the first reflector and the second reflector are located in the container, when the opening is not covered by the movable cover, the first reflector and the second reflector are capable of transmitting the light reflected by the first alignment mark to the image detector.

Since the light propagation structure is also disposed in the evaporation chamber, in order to prevent foreign particles in the evaporation chamber from falling on the reflector and affecting the reflection effect of the reflector, a container with an opening may be provided, and the first reflector and the second reflector may be disposed in the container. In case that an alignment is required, the movable cover at the opening is moved to expose the opening, so that the first reflector and the second reflector may transmit light; in case that an alignment is not required, the cover at the opening is moved to cover the opening, to prevent the foreign particles in the evaporation chamber from falling on the first reflector and the second reflector.

Figure 2:
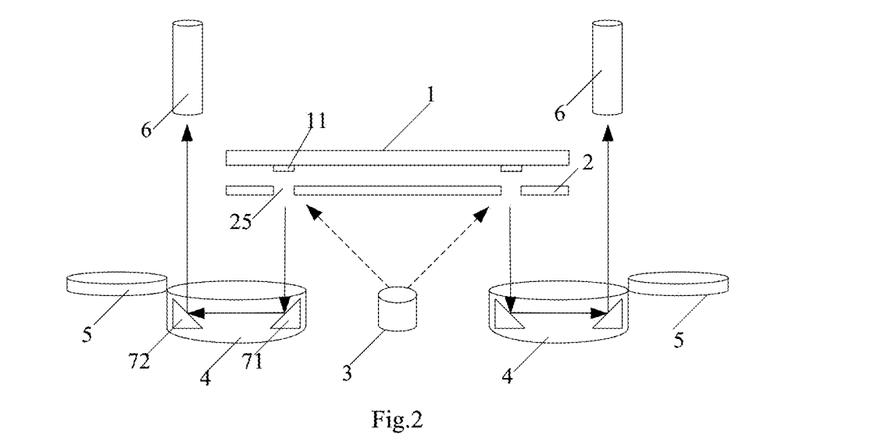
FIG. 2 is a schematic diagram of aligning a wafer and a mask in an evaporation chamber according to an embodiment of the present disclosure.
Figure 3:
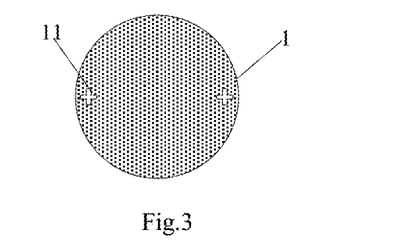
FIG. 3 is a schematic diagram of a wafer according to an embodiment of the present disclosure.
Figure 4:
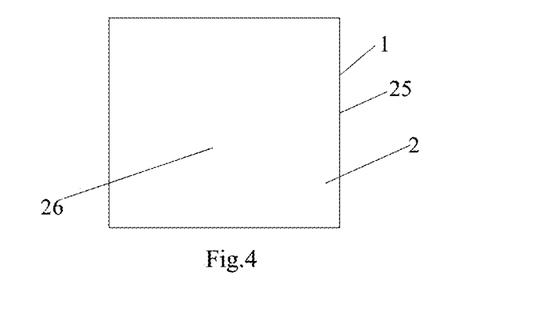
FIG. 4 is a schematic diagram of a mask for evaporation according to an embodiment of the present disclosure.

In a specific embodiment, the substrate to be evaporated being a wafer is taken as an example. As shown in FIG. 2, when the wafer 1 and the mask 2 are aligned in the evaporation chamber, the surface to be evaporated of the wafer 1 is placed downward, and the mask 2 is located directly below the wafer 1. After the coarse alignment, the orthographic projection, on the mask 2, of the first alignment mark 11 of the wafer 1 and the hollowed area 25 of the mask 2 at least partially overlap, so that the position information of at least part of the first alignment mark 11 may be obtained through the hollowed area 25. As shown in FIG. 3, in a specific example, two first alignment marks 11 may be disposed on the wafer 1. As shown in FIG. 4, in a specific example, the mask 2 includes an opening 26 corresponding to an effective display area on the wafer and a hollowed area 25 corresponding to the first alignment mark 11 on the wafer 1.

An image detector 6 is provided in the evaporation chamber. It can be seen from FIG. that, in order to prevent the foreign particles in the evaporation chamber from falling on the detection surface of the image detector 6, the image detector 6 is located above the wafer 1, and the detection surface of the image detector 6 faces downward, i.e., along the direction of gravity. A container 4 is disposed below the mask 2, and a first reflector 71 and a second reflector 72 are disposed in the container 4. The reflective surface of the first reflector 71 is oriented to the hollowed area, an included angle between the reflective surface of the second reflector 72 and the reflective surface of the first reflector 71 is a right angle, and a movable cover 5 is provided at the opening of the container 4.

After the coarse alignment, since the alignment accuracy of the wafer 1 and the mask 2 is not very high, it is necessary to use the first alignment mark 11 on the wafer 1 to finely align the wafer 1 and the mask 2. To perform the fine alignment, the cover 5 is moved to expose the opening of the container 4. A light source is used to emit light onto the first alignment mark 11, and the light reflected by the first alignment mark 11 exits through the hollowed area, reaches the reflective surface of the first reflector 71, is reflected by the reflective surface of the first reflector 71 to the reflective surface of the second reflector 72, and is reflected by the reflective surface of the second reflector 72 to the detection surface of the image detector 6, so that the position information of the first alignment mark 11 may be obtained by using the image detector, and further the wafer 1 and the mask 2 may be finely aligned by using the position information of the first alignment mark 11. When the position information of the first alignment mark 11 is obtained, in the same manner, the image detector may also obtain the position information of the second alignment mark on the mask 2 or the position information of the hollowed area 25 of the mask 2, and the relative position of the mask 2 and the wafer 1 is adjusted according to the position information of the second alignment mark or the position information of the hollowed area 25 of the mask 2, and the position information of the first alignment mark 11, to complete alignment of the mask 2 and the wafer 1. In this way, the alignment error may be controlled within 50 um, which is far superior to the conventional alignment technique. After the alignment is completed, the cover 5 may be moved to cover the opening of the container 4, to prevent foreign particles from falling on the reflector during evaporation.

In order to facilitate the image detector to obtain the position information of the first alignment mark 11 and the position information of the second alignment mark on the mask 2 or the position information of the hollowed area 25 of the mask 2, the positions of the container 4 and the first reflector 71 and the second reflector 72 in the container 4 may be adjusted, so that the image detector may obtain the position information of the first alignment mark 11 and the position information of the second alignment mark on the mask 2 or the position information of the hollowed area 25 of the mask 2.

After the alignment is completed, the evaporation process may be performed. In order to eliminate the influence of the container 4 on the evaporation, the container 4 may not be located between the evaporation source 3 and the mask 2.

In order to prevent the evaporation material from falling on the light propagation structure during evaporation as far as possible, the distance between the light propagation structure and the mask 2 may be set larger. As shown in FIG. 2, the distance between the light propagation structure and the mask 2 may be approximately equal to the distance between the evaporation source 3 and the mask 2, and the light propagation structures are located on both sides of the evaporation source 3. Since the material evaporated by the evaporation source 3 has a fan-shaped distribution, the evaporation material does not greatly affect the light propagation structure. Of course, the distance between the light propagation structure and the mask 2 may also be greater than the distance between the evaporation source 3 and the mask 2. However, the distance between the light propagation structure and the mask 2 should not be set too large. It is necessary to ensure that the image detector may obtain the position information of the first alignment mark 11 and the position information of the second alignment mark on the mask 2 or the position information of the hollowed area 25 of the mask 2.

The technical solution of the present disclosure is applicable to an opaque substrate to be evaporated, is suitable for a scenario in which the surface to be evaporated of the substrate to be evaporated faces downward and the detection surface of the image detector faces downward, and may prevent the foreign particles in the evaporation chamber from falling on the detection surface of the image detector and the substrate to be evaporated to the greatest extent.

Specifically, the substrate to be evaporated may be a wafer manufactured with a driving circuit layer and anodes. A micro OLED display may be manufactured through the technical solution of the present disclosure, to realize a high pixel density of a display product.

An embodiment of the present disclosure further provides an alignment method applied to the alignment device described above, and the alignment method includes:

determining the relative position information between the substrate to be evaporated and the mask for evaporation by using the first alignment module when the substrate to be evaporated and the mask for evaporation are outside the evaporation chamber;

after the substrate to be evaporated and the mask for evaporation are moved into the evaporation chamber, by using the second alignment module, adjusting a position of the substrate to be evaporated and/or the mask for evaporation according to the relative position information, so that an orthographic projection of a first alignment mark of the substrate to be evaporated on the mask for evaporation at least partially overlaps a hollowed area of the mask for evaporation, obtaining position information of the first alignment mark through the hollowed area, and adjusting a position of the substrate to be evaporated and/or the mask for evaporation according to the position information of the first alignment mark, to complete alignment of the substrate to be evaporated and the mask for evaporation.

In the present embodiment, firstly, the relative position information between the substrate to be evaporated and the mask for evaporation is obtained outside the evaporation chamber. After the substrate to be evaporated and the mask for evaporation enter the evaporation chamber, a coarse alignment is performed by using the relative position information between the substrate to be evaporated and the mask for evaporation, so that an orthographic projection of the first alignment mark of the substrate to be evaporated on the mask for evaporation and the hollowed area of the mask for evaporation at least partially overlap. Then, the position information of the first alignment mark is obtained through the hollowed area, and a fine alignment is performed by using the position information of the first alignment mark, so as to complete precise alignment of the substrate to be evaporated and the mask for evaporation. Through the technical solution of the present disclosure, precise alignment of the substrate to be evaporated and the mask for evaporation may be completed in case that the substrate to be evaporated is opaque. In order to ensure that the position information of the first alignment mark may be obtained through the mask for evaporation, it is necessary to provide a hollowed area on the mask for evaporation, so that the position information of the first alignment mark may be obtained through the hollowed area of the mask for evaporation.

Further, the determining the relative position information between the substrate to be evaporated and the mask for evaporation when the substrate to be evaporated and the mask for evaporation are outside the evaporation chamber includes:

by using the image acquisition unit, scanning the third alignment mark of the substrate to be evaporated to determine first position information of the center of the substrate to be evaporated, and scanning the second alignment mark of the mask for evaporation to determine the second position information of the center of the mask for evaporation;

determining the relative position information between the substrate to be evaporated and the mask for evaporation according to the first position information and the second position information by using the processing unit.

The third alignment mark may be at least one location point on the edge of the substrate to be evaporated, and the first position information of the center of the substrate to be evaporated may be determined through the position information of the third alignment mark. In case that the substrate to be evaporated is circular, since a circle may be defined by three points, the third alignment mark may be three location points on the edge of the substrate to be evaporated. The position information of the substrate to be evaporated may be determined based on the three location points, and then the first position information of the center of the substrate to be evaporated may be determined. In case that the substrate to be evaporated is of other shapes, the quantity of location points of the third alignment mark may be determined based on the shape of the substrate to be evaporated, as long as the position of the substrate to be evaporated may be uniquely determined based on the third alignment mark.

Specifically, the image acquisition unit may adopt the CCD. Taking the substrate to be evaporated being a wafer for example, as shown in FIG. 1, outside the evaporation chamber, the position information of the three location points A, B, and C on the edge of the wafer 1 may be acquired through the CCD, and the position information of the center D of the wafer 1 is determined based on the position information of A, B, and C; since the area of the mask 2 for evaporation is larger than the area of the wafer 1, when the wafer 1 is located above the mask 2, the second alignment mark on the mask 2 may still be exposed and may be acquired by the CCD. As shown in FIG. 1, the position information of the three second alignment marks 21, 22, and 23 on the mask 2 is acquired through the CCD separately, and the position information of the center 24 of the mask is determined according to the position information of 21, 22 and 23. Then, the relative position information between the center D and the center 24 may be determined according to the position information of the center D of the wafer 1 and the position information of the center 24 of the mask 2, i.e., the relative position information between the wafer 1 and the mask 2 may be determined. As shown in FIG. 1, the relative position information includes the distance X between the center D and the center 24 on the x axis, the distance Y between the center D and the center 24 on the y axis, and an included angle $\theta$ between a line connecting the center D and the center 24 and the y axis.

In the process of moving the substrate to be evaporated and the mask for evaporation from outside of the evaporation chamber into the evaporation chamber, the relative position of the substrate to be evaporated and the mask for evaporation remains substantially unchanged. Therefore, after the substrate to be evaporated and the mask for evaporation enter the evaporation chamber, the relative position information between the substrate to be evaporated and the mask for evaporation obtained previously outside the evaporation chamber may be used to align the substrate to be evaporated and the mask for evaporation. This alignment is done by means of data comparison, so there are some errors. But it can have a coarse alignment effect.

Further, obtaining the position information of the first alignment mark through the hollowed area includes:

emitting light onto the first alignment mark by using the light source;

transmitting the light reflected by the first alignment mark to the image detector by using the light propagation structure;

obtaining the position information of the first alignment mark by using the image detector.

In order to prevent foreign particles in the evaporation chamber from falling on the substrate to be evaporated, the surface to be evaporated of the substrate to be evaporated is placed in a face-down manner in the evaporation chamber, i.e., along the direction of gravity. The mask for evaporation is located directly below the substrate to be evaporated. In addition, in order to prevent foreign particles from falling on the detection surface of the image detector and misting the lens on the detection surface, the detection surface of the image detector is also placed downward. In order to ensure that the image detector may acquire the image of the first alignment mark, it is necessary to use a light propagation structure to transmit the light reflected by the first alignment mark to the image detector. Specifically, the image detector may also adopt a CCD.

The light propagation structure may include:

a first reflector, located on a side of the mask for evaporation that is facing away from the substrate to be evaporated, and having a reflective surface oriented to the hollowed area;

a second reflector, having a reflective surface oriented to the reflective surface of the first reflector and the detection surface of the image detector.

That the reflective surface of the first reflector is oriented to the hollowed area refers to: the light exiting through the hollowed area may reach the reflective surface of the first reflector and be reflected by the reflective surface of the first reflector. That the reflective surface of the second reflector is oriented to the reflective surface of the first reflector and the detection surface of the image detector refers to: the light emitted by the reflective surface of the first reflector may reach the reflective surface of the second reflector and be reflected by the reflective surface of the second reflector, and the detection surface of the image detector may receive the light reflected by the reflective surface of the second reflector.

In an optional embodiment, an included angle between the reflective surfaces of the first reflector and the second reflector is 90°. In this case, the propagation direction of the light incident on the reflective surface of the first reflector is parallel to the propagation direction of the light exiting through the reflective surface of the second reflector.

Since the light propagation structure is also disposed in the evaporation chamber, in order to prevent the foreign particles in the evaporation chamber from falling on the reflector and affecting the reflection effect of the reflector, a container with an opening may be provided, and the first reflector and the second reflector may be disposed in the container. In case that an alignment is required, the cover at the opening is moved to expose the opening, so that the first reflector and the second reflector may transmit light; in case that an alignment is not required, the cover at the opening is moved to cover the opening to prevent the foreign particles in the evaporation chamber from falling on the first reflector and the second reflector.

Further, prior to obtaining the position information of the first alignment mark through the hollowed area, the method further includes:

exposing the opening of the container by moving the movable cover;

after completing the alignment of the substrate to be evaporated and the mask for evaporation, the method further includes:

covering the opening of the container by moving the movable cover.

In a specific embodiment, the substrate to be evaporated being a wafer is taken as an example. As shown in FIG. 2, when the wafer 1 and the mask 2 are aligned in the evaporation chamber, the surface to be evaporated of the wafer 1 is placed downward, the mask 2 is located directly below the wafer 1. After the coarse alignment, the orthographic projection, on the mask 2, of the first alignment mark 11 on the wafer 1 and the hollowed area 25 of the mask 2 at least partially overlap, so that the position information of at least part of the first alignment mark 11 may be obtained through the hollowed area 25. As shown in FIG. 3, in a specific example, two first alignment marks 11 may be disposed on the wafer 1. As shown in FIG. 4, in a specific example, the mask 2 includes an opening 26 corresponding to an effective display area on the wafer and a hollowed area 25 corresponding to the first alignment mark 11 on the wafer 1.

An image detector 6 is disposed in the evaporation chamber. It can be seen from FIG. 2 that, in order to prevent the foreign particles in the evaporation chamber from falling on the detection surface of the image detector 6, the image detector 6 is located above the wafer 1, and the detection surface of the image detector 6 faces downward, i.e., along the direction of gravity. A container 4 is disposed below the mask 2, and a first reflector 71 and a second reflector 72 are disposed in the container 4. The reflective surface of the first reflector 71 is oriented to the hollowed area, the included angle between the reflective surface of the second reflector 72 and the reflective surface of the first reflector 71 is a right angle, and a movable cover 5 is provided at the opening of the container 4.

After the coarse alignment, since the alignment accuracy of the wafer 1 and the mask 2 is not very high, it is necessary to use the first alignment mark 11 on the wafer 1 to finely align the wafer 1 and the mask 2. During the fine alignment, the cover 5 is moved to expose the opening of the container 4. A light source is used to emit light onto the first alignment mark 11, and the light reflected by the first alignment mark 11 exits through the hollowed area, reaches the reflective surface of the first reflector 71, is reflected by the reflective surface of the first reflector 71 to the reflective surface of the second reflector 72, and is reflected by the reflective surface of the second reflector 72 to the detection surface of the image detector 6, so that the position information of the first alignment mark 11 may be obtained by using the image detector, and the wafer 1 and the mask 2 may be finely aligned by using the position information of the first alignment mark 11. In case that the position information of the first alignment mark 11 is obtained, in the same manner, the image detector may also obtain the position information of the second alignment mark on the mask 2 or the position information of the hollowed area 25 of the mask 2, and the relative position of the mask 2 and the wafer 1 is adjusted according to the position information of the second alignment mark or the position information of the hollowed area 25 of the mask 2, and the position information of the first alignment mark 11, to complete alignment of the mask 2 and the wafer 1. In this way, the alignment error may be controlled within 50 um, which is far superior to the conventional alignment technique. After the alignment is completed, the cover 5 may be moved to cover the opening of the container 4 to prevent foreign particles from falling on the reflector during evaporation.

In order to facilitate the image detector to obtain the position information of the first alignment mark 11 and the position information of the second alignment mark on the mask 2 or the position information of the hollowed area 25 of the mask 2, the positions of the container 4 and the first reflector 71 and the second reflector 72 in the container 4 may be adjusted, so that the image detector may obtain the position information of the first alignment mark 11 and the position information of the second alignment mark on the mask 2 or the position information of the hollowed area 25 of the mask 2.

An embodiment of the present disclosure further provides evaporation equipment including the alignment device as described above. The evaporation equipment of this embodiment is applicable to an opaque substrate to be evaporated, is suitable for a scenario in which the surface to be evaporated of the substrate to be evaporated faces downward and the detection surface of the image detector faces downward, and may prevent the foreign particles in the evaporation chamber from falling on the detection surface of the image detector and the substrate to be evaporated to the greatest extent.

Unless defined otherwise, technical and scientific terms used in the present disclosure have common meaning understood by those of ordinary skill in the art to which the present disclosure belong. The terms "first", "second", and the like used in the present disclosure do not indicate any order, any quantity, or any importance, but are only used to distinguish different components. Words such as "include" or "comprise" mean that the element or item appearing before the word encompass elements or items appearing after the word and the equivalent thereof without excluding other elements or items. Words such as "connected" or "connecting" are not limited to physical or mechanical connections, but may include electrical connections, no matter direct or indirect. "Up", "down", "left", "right", etc. are only used to indicate the relative position relationship. When the absolute position of the described object changes, the relative position relationship may also change accordingly.

It may be understood that when an element such as a layer, a film, a region, or a substrate is referred to as being located "on" or "under" another element, it can be "directly" located "on" or "under" the other element, or intervening elements may be present.

The descriptions above are optional embodiments of the disclosure. It is appreciated, modifications and improvements may be made by a person of ordinary skill in the art without departing from the principle of the present disclosure, and these modifications and improvements shall fall within the scope of the present disclosure.

What is claimed is:

1. An alignment device, comprising:
a first alignment module, located outside an evaporation chamber and configured to determine relative position information between a substrate to be evaporated and a mask for evaporation; and
a second alignment module, located in the evaporation chamber and configured to adjust a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtain position information of the first alignment mark through the hollowed area, and adjust a position of at least one of the substrate to be evaporated and the mask for evaporation according to the position information,
wherein, in the evaporation chamber, the mask for evaporation is located directly below the substrate to be evaporated, the second alignment module comprises:
a light source, configured to emit light onto the first alignment mark;
an image detector, located on a side of the substrate to be evaporated that is facing away from the mask for evaporation, wherein a detection surface of the image detector faces downward; and
a light propagation structure, located on a side of the mask for evaporation that is facing away from the substrate to be evaporated, the light propagation structure directly facing the hollowed area, and configured to transmit light reflected by the first alignment mark to the image detector, and
wherein the light propagation structure comprises:
a first reflector, located on a side of the mask for evaporation that is facing away from the substrate to be evaporated, and having a reflective surface oriented to the hollowed area; and
a second reflector, having a reflective surface oriented to the reflective surface of the first reflector and the detection surface of the image detector.

2. The alignment device according to claim 1, wherein the first alignment module comprises:
an image acquisition unit, configured to scan a third alignment mark of the substrate to be evaporated to determine first position information of a center of the substrate to be evaporated, and configured to scan a second alignment mark of the mask for evaporation to determine second position information of a center of the mask for evaporation;
a processing unit, configured to determine the relative position information between the substrate to be evaporated and the mask for evaporation according to the first position information and the second position information.

3. The alignment device according to claim 1, wherein an included angle between the reflective surface of the first reflector and the reflective surface of the second reflector is 90°.

4. The alignment device according to claim 1, wherein the light propagation structure further comprises: a container having an opening oriented to the mask for evaporation and a movable cover provided at the opening, the movable cover is configured to cover or expose the opening by moving;
wherein, the first reflector and the second reflector are located in the container, in case that the opening is not covered by the movable cover, the first reflector and the second reflector are configured to transmit the light reflected by the first alignment mark to the image detector.

5. The alignment device according to claim 4, wherein the first reflector and the second reflector are movably disposed in the container.

6. The alignment device according to claim 1, wherein a distance between the light propagation structure and the mask for evaporation is greater than or equal to a distance between an evaporation source and the mask for evaporation.

7. The alignment device according to claim 6, wherein the second alignment module comprises two light propagation structures; the two light propagation structures are respectively located on two sides of the evaporation source.

8. An alignment method, applied to the alignment device according to claim 1, comprising:
determining the relative position information between the substrate to be evaporated and the mask for evaporation by using the first alignment module when the substrate to be evaporated and the mask for evaporation are outside the evaporation chamber;
after the substrate to be evaporated and the mask for evaporation are moved into the evaporation chamber, by using the second alignment module, adjusting a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtaining position information of the first alignment mark through the hollowed area, and adjusting a position of at least one of the substrate to be evaporated and the mask for evaporation according to the position information, to complete alignment of the substrate to be evaporated and the mask for evaporation.

9. An alignment method, applied to the alignment device according to claim 2, comprising:
determining the relative position information between the substrate to be evaporated and the mask for evaporation by using the first alignment module when the substrate to be evaporated and the mask for evaporation are outside the evaporation chamber;
after the substrate to be evaporated and the mask for evaporation are moved into the evaporation chamber, by using the second alignment module, adjusting a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtaining position information of the first alignment mark through the hollowed area, and adjusting a position of at least one of the substrate to be evaporated and the mask for evaporation according to the position information, to complete alignment of the substrate to be evaporated and the mask for evaporation,
wherein the determining the relative position information between the substrate to be evaporated and the mask for evaporation when the substrate to be evaporated and the mask for evaporation are outside the evaporation chamber comprises:
by using the image acquisition unit, scanning the third alignment mark of the substrate to be evaporated to determine the first position information of the center of the substrate to be evaporated, and scanning the second alignment mark of the mask for evaporation to determine the second position information of the center of the mask for evaporation;
determining the relative position information between the substrate to be evaporated and the mask for evaporation according to the first position information and the second position information by using the processing unit.

10. An alignment method, applied to the alignment device according to claim 1, comprising:
determining the relative position information between the substrate to be evaporated and the mask for evaporation by using the first alignment module when the substrate to be evaporated and the mask for evaporation are outside the evaporation chamber;
after the substrate to be evaporated and the mask for evaporation are moved into the evaporation chamber, by using the second alignment module, adjusting a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtaining position information of the first alignment mark through the hollowed area, and adjusting a position of at least one of the substrate to be evaporated and the mask for evaporation according to the position information, to complete alignment of the substrate to be evaporated and the mask for evaporation,
wherein the obtaining the position information of the first alignment mark through the hollowed area comprises:
emitting light onto the first alignment mark by using the light source;
transmitting the light reflected by the first alignment mark to the image detector by using the light propagation structure;
obtaining the position information of the first alignment mark by using the image detector.

11. An alignment method, applied to the alignment device according to claim 4, comprising:
determining the relative position information between the substrate to be evaporated and the mask for evaporation by using the first alignment module when the substrate to be evaporated and the mask for evaporation are outside the evaporation chamber;
after the substrate to be evaporated and the mask for evaporation are moved into the evaporation chamber, by using the second alignment module, adjusting a position of at least one of the substrate to be evaporated and the mask for evaporation according to the relative position information until an orthographic projection of a first alignment mark of the substrate to be evaporated on the mask for evaporation at least partially overlaps a hollowed area of the mask for evaporation, obtaining position information of the first alignment mark through the hollowed area, and adjusting a position of at least one of the substrate to be evaporated and the mask for evaporation according to the position information, to complete alignment of the substrate to be evaporated and the mask for evaporation,
wherein the obtaining the position information of the first alignment mark through the hollowed area comprises:
emitting light onto the first alignment mark by using the light source;
transmitting the light reflected by the first alignment mark to the image detector by using the light propagation structure;
obtaining the position information of the first alignment mark by using the image detector, wherein, prior to the obtaining the position information of the first alignment mark through the hollowed area, the method further comprises:

exposing the opening of the container by moving the movable cover;

after completing the alignment of the substrate to be evaporated and the mask for evaporation, the method further comprises:

covering the opening of the container by moving the movable cover.

12. Evaporation equipment, comprising the alignment device according to claim 1.

13. Evaporation equipment, comprising the alignment device according to claim 2.

14. Evaporation equipment, comprising the alignment device according to claim 3.

15. Evaporation equipment, comprising the alignment device according to claim 4.

16. Evaporation equipment, comprising the alignment device according to claim 5.

* * * * *